United States Patent
Yoon et al.

(10) Patent No.: US 9,276,397 B2
(45) Date of Patent: Mar. 1, 2016

(54) DRIVE CONTROL METHOD BASED ON DETECTED DIELECTRIC BREAKDOWN

(71) Applicant: Hyundai Motor Company, Seoul (KR)

(72) Inventors: Jong Hu Yoon, Jeollanam-do (KR); Mi Ok Kim, Seongnam-si (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/330,623

(22) Filed: Jul. 14, 2014

(65) Prior Publication Data

US 2015/0155702 A1    Jun. 4, 2015

(30) Foreign Application Priority Data

Dec. 3, 2013 (KR) .................. 10-2013-0149371

(51) Int. Cl.
| | |
|---|---|
| H02H 7/08 | (2006.01) |
| B60W 10/02 | (2006.01) |
| H02H 3/16 | (2006.01) |
| G01R 31/36 | (2006.01) |
| G01R 31/34 | (2006.01) |
| G01M 17/00 | (2006.01) |
| B60L 3/04 | (2006.01) |
| H02H 3/087 | (2006.01) |
| H02H 3/10 | (2006.01) |
| H02H 3/20 | (2006.01) |
| B60K 6/442 | (2007.10) |

(52) U.S. Cl.
CPC .. *H02H 3/16* (2013.01); *B60L 3/04* (2013.01); *G01M 17/00* (2013.01); *G01R 31/343* (2013.01); *G01R 31/3606* (2013.01); *H02H 3/087* (2013.01); *H02H 3/105* (2013.01); *H02H 3/207* (2013.01); *B60K 6/442* (2013.01)

(58) Field of Classification Search
CPC ....... H02H 3/16; G01M 17/00; G01R 31/343; G01R 31/3606; B60K 6/442
USPC .......................................... 318/400.21; 477/5
See application file for complete search history.

(56) References Cited

U.S. PATENT DOCUMENTS

2010/0246081 A1* 9/2010 Yano et al. ................... 361/91.5
2011/0320088 A1* 12/2011 Eom et al. ....................... 701/29

(Continued)

FOREIGN PATENT DOCUMENTS

| JP | 2008-137558 A | 6/2008 |
| JP | 2011-155743 A | 8/2011 |

(Continued)

OTHER PUBLICATIONS

Korean Office Action issued in Korean Application No. 10-2013-0149371 dated Mar. 17, 2015.

*Primary Examiner* — Bentsu Ro
*Assistant Examiner* — Zemenay Truneh
(74) *Attorney, Agent, or Firm* — McDermott Will & Emery LLP

(57) ABSTRACT

A drive control method based on detected dielectric breakdown is provided. The drive control method includes individually determining whether dielectric breakdown of high voltage components occurs according to whether a switch for electrically connecting a high voltage battery and other high voltage components is opened and a condition of each of the high voltage components when dielectric resistance of a vehicle is measured to determine that dielectric breakdown of a high voltage system occurs. An operation of the high voltage components, the dielectric breakdown of which occurs, is stopped according to a determination result, when dielectric breakdown of high voltage components, which do not affect vehicle driving among the high voltage components, occurs.

9 Claims, 2 Drawing Sheets

(56) References Cited

U.S. PATENT DOCUMENTS

2012/0120530 A1* 5/2012 Yoon ............................. 361/42
2012/0302396 A1* 11/2012 Park ....................... B60K 6/442
             477/5

FOREIGN PATENT DOCUMENTS

| KR | 10-2011-0116805 A | 10/2011 |
| KR | 10-2013-0042136 A | 4/2013 |
| KR | 10-1283042 B1 | 7/2013 |

* cited by examiner

DRIVE CONTROL METHOD BASED ON DETECTED DIELECTRIC BREAKDOWN

CROSS REFERENCE TO RELATED APPLICATION

The present application claims the benefit of priority to Korean Patent Application Number 10-2013-0149371 filed on Dec. 3, 2013, the entire contents of which is incorporated herein for all purposes by this reference.

TECHNICAL FIELD

The present disclosure relates to a drive control method based on detected dielectric breakdown, and more particularly, to a drive control method based on detected dielectric breakdown for controlling drive by detecting whether a high voltage component is abnormal.

BACKGROUND

A hybrid vehicle using a high voltage battery includes a system that automatically shuts off power of a main high voltage battery in an emergency. The emergency refers to excessive electric leakage due to deterioration of related components or excessive electric leakage due to a short-circuit caused by component breakdown as a result of external shock, such as dielectric breakdown, dielectric breakdown, and so on.

In a state of emergency of a vehicle, an upper component for controlling a high voltage component such as a battery management system (BMS), a hybrid controller (HC), or the like issues a command for shutting a main power to power off.

A high voltage related component monitors a voltage and current of a connecting path for the power via a predetermined program or sensor. In this case, when the detected voltage or the current is outside a normal range, or a leakage current value is greater than an allowable value, and a dielectric resistance breakdown value which is greater than the allowable value are present, the main power is shut off via CAN communication or signal transmission.

With respect to the hybrid vehicle, a fuel battery vehicle and the like that use the high voltage battery, it is important to measure dielectric resistance. The dielectric resistance is measured by using various methods. During the measurement of the dielectric resistance, resistance between chassis ground and the high voltage battery is measured to determine whether or not dielectric breakdown occurs.

In this case, when the detected and measured dielectric resistance value is greater than the allowable value, or a component such as a low voltage direct current (DC) converter (LDC), an on-board charger (OBC), a positive temperature coefficient (PTC), an air conditioner (A/C), an inverter, a motor, and so on as well as a high voltage component such a battery management system (BMS), a hybrid controller (HC), a fuel cell controller (FC), and so on is abnormal, the dielectric resistance value which is greater than the allowable value may be detected.

However, conventionally, when the dielectric breakdown such as a stop state, a drive state, a regenerative braking state, and so on of the vehicle occurs, whether or not the dielectric breakdown occurs is simply examined, and it is not possible to check an actual faulty component. Accordingly, a relay of the high voltage battery is powered off to handle the dielectric breakdown. In this case, even though driving is possible without the faulty component, when the detected dielectric resistance value is equal to or greater than the allowable value, since the relay of the high voltage battery is powered off, driving is not possible.

The description of the related art is to aid in understanding of the present disclosure and is not to be construed as conventional arts that are already known to those of ordinary skill in the art.

SUMMARY

An aspect of the present disclosure provides a drive control method based on detected dielectric breakdown for detecting a faulty component when the dielectric breakdown of a high voltage system occurs and controlling driving of a vehicle.

According to an exemplary embodiment of the present disclosure, a drive control method based on detected dielectric breakdown is provided. The method includes individually determining whether dielectric breakdown of high voltage components occurs according to whether a switch for electrically connecting a high voltage battery and the high voltage components is opened, and a condition of each of the high voltage components when dielectric resistance of a vehicle is measured to determine that the dielectric breakdown of a high voltage system occurs. An operation of the high voltage components, the dielectric breakdown of which occurs, is stopped according to a determination result when the dielectric breakdown of the high voltage components, which do not affect vehicle driving among the high voltage components, occurs.

The step of determining may include determining that the dielectric breakdown of the high voltage battery occurs when the vehicle is in an on state, and the switch is in an off state.

The method may further include maintaining the off state of the switch upon determining that the dielectric breakdown of the high voltage battery occurs.

The step of determining may include determining whether the dielectric breakdown of remaining high voltage components except for the high voltage battery occurs when the switch is in an on state.

The step of determining may include determining that the dielectric breakdown of a high voltage three-phase component occurs when the switch is in an on state, and the high voltage three-phase component is operated via three-phase switching control among the high voltage components.

The step of determining may include determining that the dielectric breakdown of a driving motor occurs when the switch is in an on state, and a motor torque control command is applied to the driving motor.

The step of stopping may include limiting initial output power of the high voltage battery and opening the switch after a set period of time elapses, such that the switch is not in an on state during restart of the vehicle.

The step of determining may include determining that the dielectric breakdown of a hybrid starter generator (HSG) motor occurs when the switch is in an on state, and an HSG motor torque control command is applied to the HSG motor.

The step of stopping may include stopping a regenerative braking operation of the HSG motor.

The step of determining may include determining that the dielectric breakdown of an air blower motor of an air compressor occurs when the switch is in the on state, and the air blower motor operates.

The step of determining may include determining that the dielectric breakdown of the high voltage components except for the high voltage battery, and the high voltage three-phase component occurs when the switch is in the on state, and the high voltage three-phase component does not operate.

DETAILED DESCRIPTION

Figure 1:
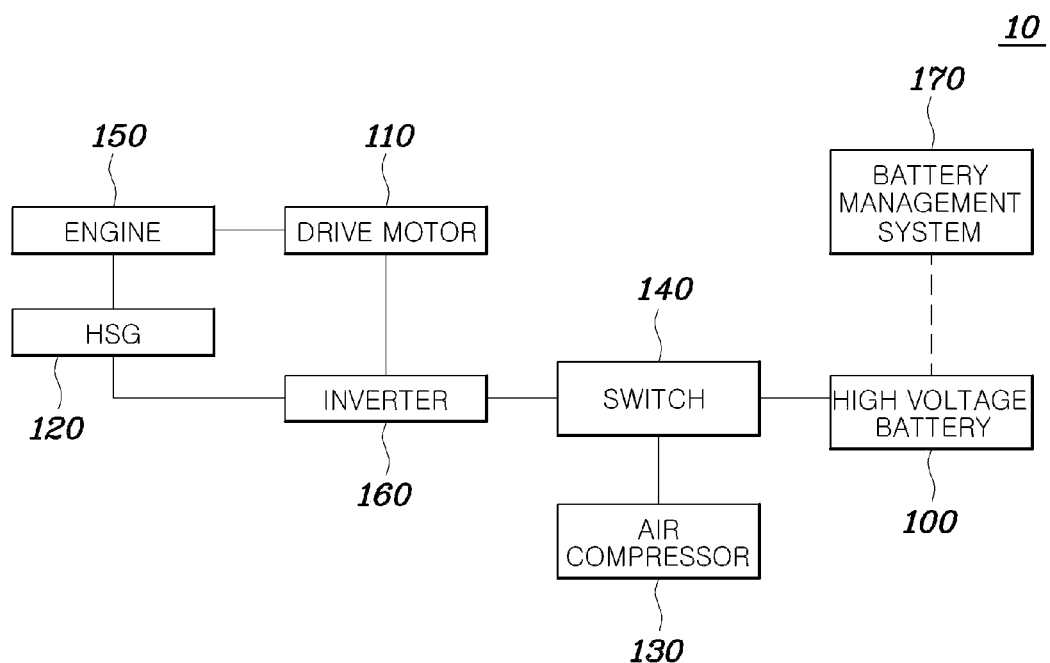
FIG. 1 is a schematic block diagram of a hybrid vehicle high voltage system according to an embodiment of the present disclosure.

Particular structural and functional descriptions of embodiments of the present disclosure disclosed in the specification are only for the purpose of describing particular embodiments. The embodiments of the present disclosure are formed in many different forms and should not be construed as being limited to the embodiments set forth herein.

As the disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element, and a second element may be termed a first element without departing from the teachings of the present disclosure.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be described in detail by explaining exemplary embodiments of the disclosure with reference to the attached drawings. Like reference numerals in the drawings denote like elements.

FIG. 1 is a schematic block diagram of a hybrid vehicle high voltage system according to an embodiment of the present disclosure. Referring to FIG. 1, a hybrid vehicle high voltage system 10 may include a high voltage battery 100, a drive motor 110, a hybrid starter generator (HSG) 120, an air compressor 130, a switch (main relay) 140, an engine 150, an inverter 160, and a battery management system (BMS) 170. High voltage components may operate using power stored in the high voltage battery 100. The high voltage components are largely classified into high voltage three-phase components and high voltage direct current (DC) component. The drive motor 110, the HSG 120, and the air compressor 130 are high voltage three-phase components, and the high voltage battery 100 is a high voltage DC component.

The high voltage three-phase component is operated by controlling a three-phase switch. The BMS 170 may measure dielectric resistance to check whether dielectric breakdown occurs only when the high voltage three-phase components operate. According to the properties whereby dielectric resistance can be measured to check whether the dielectric breakdown occurs only when the high voltage three-phase components operate, whether or not the drive motor 110, the HSG 120, and the air compressor 130 are switched on may be determined via a related parameter of a CAN message. It may be determined that the dielectric breakdown of the corresponding components occurs when dielectric breakdown occurs at an operating point. The related parameter of the CAN message may be a torque control command parameter of the drive motor 110 and the HSG 120 (drive motor torque control command >0, and HSG motor torque control command >0).

On the other hand, whether or not the dielectric breakdown of the high voltage battery 100 occurs may be determined in an ignition (IG) on state in which the switch 140 between the high voltage battery 100 and other high voltage components is opened, and the high voltage battery 100 is not connected to a vehicle. When the switch 140 is opened, the dielectric resistance measured by the battery management system 170 is associated with the high voltage battery 100.

When the dielectric resistance of the entire vehicle is measured to determine that the dielectric breakdown of the high voltage system 10 occurs, whether or not the dielectric breakdown of the high voltage components 100, 110, 120, and 130 occurs is individually determined according to whether the switch 140 for electrically connecting the high voltage battery 100 and other high voltage components 110, 120, and 130 is opened and a condition of each of the high voltage components 100, 110, 120, and 130. According to the determination result, when the dielectric breakdown of the high voltage components, which do not affect the vehicle from driving among the high voltage components 100, 110, 120, and 130, occurs, only an operation of the high voltage components, dielectric breakdown of which occurs, is stopped.

In detail, when the vehicle is in the IG on, and the switch 140 is in an off state, the battery management system 170 determines that the dielectric breakdown of the high voltage battery 100 occurs. When it is determined that the dielectric breakdown of the high voltage battery 100 occurs, the off state of the switch 140 is maintained. When the switch 140 is in the on state, whether dielectric breakdown of remaining high voltage components 110, 120, and 130 except for the high voltage battery 100 occurs is determined. When the switch 140 is in the on state, the battery management system 170 may determine whether dielectric breakdown of the high voltage three-phase components 110, 120, and 130 occurs according to whether a torque control command is present in the case of the drive motor 110 and the HSG 120, which are operated via three-phase switching control, among the high voltage components 100, 110, 120, and 130. In addition, when the switch 140 is in the on state, the battery management system 170 may determine whether the dielectric breakdown of the high voltage three-phase components 110, 120, and 130 occurs according to whether a torque control command is present in the case of the air compressor 130 according to whether the switch 140 is in the on state.

When the switch 140 is in the on state, the battery management system 170 determines that the dielectric breakdown of the drive motor 110 occurs when a torque control command is present in the drive motor 110. Upon determining that the dielectric breakdown of the drive motor 110 occurs, when a set period of time elapses after the battery management system 170 limits initial output power of the high voltage battery 100, the battery management system 170 may open the switch 140, such that the switch 140 is not in the on state during restart of a vehicle. When the switch 140 is in the on state, if the torque control command is present in the HSG 120, the battery management system 170 determines that dielectric breakdown of the HSG 120 occurs, stops a regenerative braking operation of the HSG 120, and normally controls the remaining high voltage components. When the switch 140 is in the on state, if an air blower motor of the air compressor 130 operates, the battery management system 170 determines that the dielectric breakdown of the air blower motor occurs. In this case, the battery management system 170 prevents use of the air compressor 130 and normally controls the remaining high voltage component.

When the switch 140 is in the on state, if the high voltage three-phase components 110, 120, and 130 do not operate, the battery management system 170 determines that the dielectric breakdown of high voltage components except for the high voltage battery 100 and the high voltage three-phase components 110, 120, and 130 occurs. In detail, when the switch 140 is in the on state, all the drive motor 110, the HSG 120, and the air compressor 130 do not operate, the battery management system 170 determines that dielectric breakdown of a low-voltage direct current (DC) converter (LDC) or other components occurs and limits output power of the high voltage battery 100.

Figure 2:
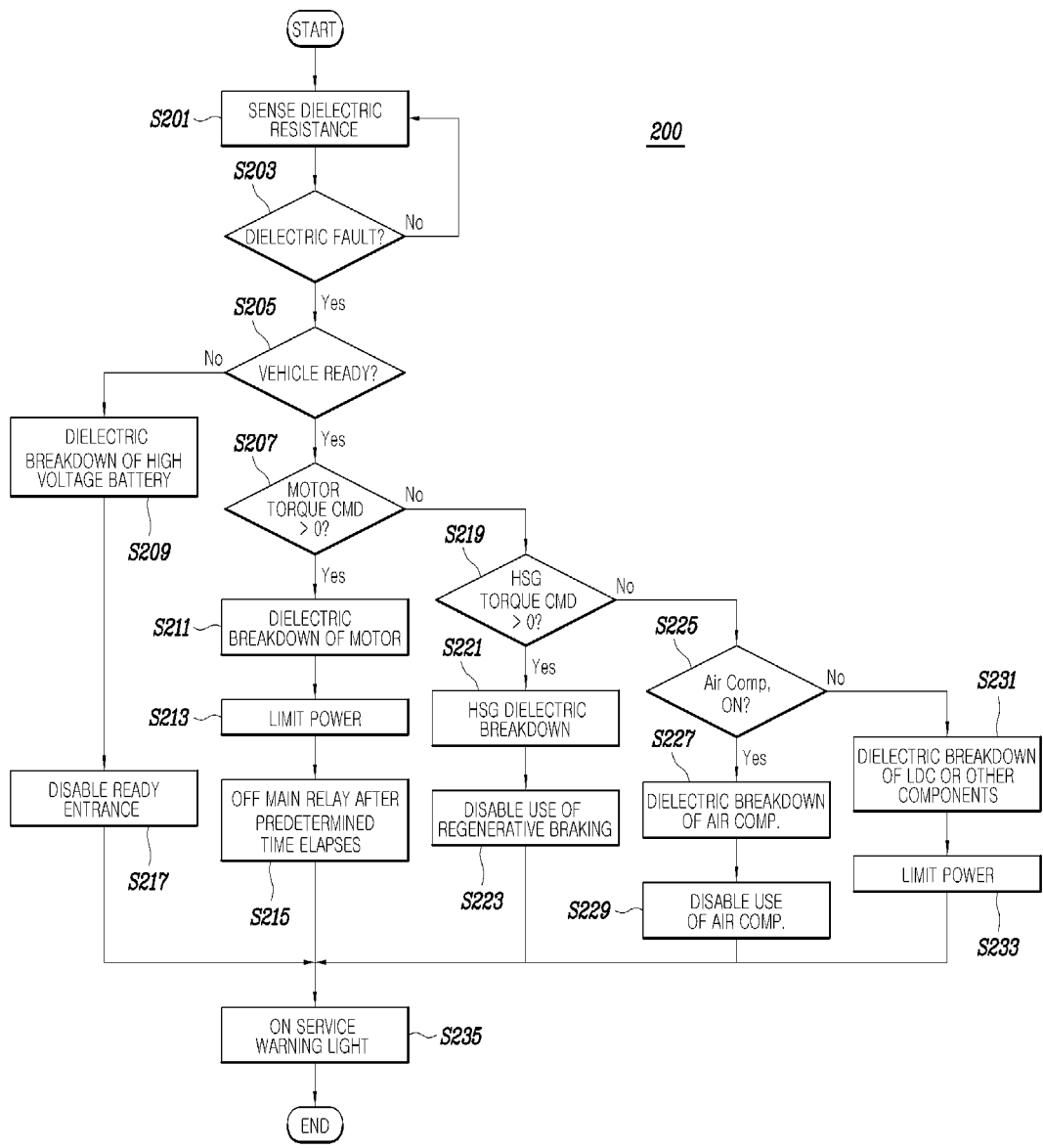
FIG. 2 is a flowchart of a drive control method based on detected dielectric breakdown according to an embodiment of the present disclosure.

FIG. 2 is a flowchart of a drive control method 200 based on detected dielectric breakdown according to an embodiment of the present disclosure. Referring to FIGS. 1 and 2, the drive control method 200 based on the detected dielectric breakdown includes sensing for dielectric resistance of a vehicle (S201). When whether or not dielectric breakdown occurs is determined based on dielectric resistance (S203), if the dielectric breakdown occurs, whether the vehicle is in a ready state according to on/off of the switch 140 for connecting the high voltage battery 100 and other high voltage components (S205).

When the vehicle is not in the ready state, it is determined that the dielectric breakdown of the high voltage battery 100 occurs (S209), and then the vehicle is controlled not to enter the ready state (S217). When the vehicle is in the ready state, whether or not the dielectric breakdown of the drive motor 110, the HSG 120, or the air compressor 130 occurs may be determined according to whether a torque control command of the drive motor 110 is present, whether a torque control command of the HSG 120 is present, or whether the air compressor 130 operates. The drive motor 110 and the HSG 120 operate via three-phase switching control. At this moment, whether the dielectric breakdown of the drive motor 110 and the HSG 120 occurs may be determined by measuring the dielectric resistance. Accordingly, according to whether a motor torque control command is present, when the motor torque control command is present, the dielectric resistance may be measured, and thus, whether or not the dielectric breakdown occurs may be determined.

First, according to whether a torque control command of the drive motor 110 is present (S207), if the torque control command of the drive motor 110 is present, it is determined that the dielectric breakdown of the drive motor 110 occurs (S211). In this case, initial battery output power may be limited (S213), the switch 140 may be opened after a set period of time elapses (S215), and the vehicle may also be controlled not to be in on the ready state during restart of the vehicle.

When the torque control command of the drive motor 110 is not present, according to whether the torque control command of the HSG 120 is present (S219), if the torque control command is present in the HSG 120, it is determined that the dielectric breakdown of the HSG 120 occurs (S221), and regenerative braking motor control becomes off (S223). That is, since the dielectric breakdown of the HSG 120 occurs, the HSG 120 may be controlled to disable regenerative braking (S223).

When the torque control command of the HSG 120 is not present, according to whether the air compressor 130 is in the on state (S225), if the air compressor 130 is in the on state, it may be determined that dielectric breakdown of the air compressor 130 occurs (S227), and the air compressor 130 may be prevented from being used (S229). When the air compressor 130 is not in the on state, it is determined that dielectric breakdown of a low voltage direct current (DC) converter (LDC) or other high voltage components occurs (S231), and battery output power may be limited (S233).

Control subjects of the respective operations may be lower controllers or upper controllers thereof for individually controlling the drive motor 110, the HSG 120, the air compressor 130, and so on, and may be, for example, a hybrid controller (HC), a motor controller (MC), a vehicle controller (VC), a battery management system (BMS), and so on. When the dielectric breakdown of the high voltage battery 100, the drive motor 110, the HSG 120, the air compressor 130, and the LDC occurs, a service warning light may be on (S235).

That is, when dielectric breakdown of a vehicle occurs, dielectric resistance of the vehicle may be measured to determine whether the dielectric breakdown occurs. Although the corresponding high voltage component, dielectric breakdown of which occurs, is detected, and a problem arises during vehicle driving, influence of the dielectric breakdown may be minimized via active control to allow the vehicle driving. When a vehicle dielectric resistance value is measured at a point of dielectric breakdown, if the vehicle dielectric resistance value is equal to or less than a reference value, it is determined that the dielectric breakdown occurs. When dielectric breakdown of the vehicle occurs while it is determined that the dielectric breakdown occurs, the vehicle may also be controlled as long as vehicle driving is not affected by dielectric breakdown.

According to an embodiment of the present disclosure, when the dielectric breakdown of the vehicle occurs, components, dielectric breakdown of which occurs and which do not affect vehicle driving, are not controlled to drive the vehicle, instead of opening the relay 140 of the high voltage battery 100, thereby increasing driving efficiency of the vehicle.

According to a drive control method based on detected dielectric breakdown according to an embodiment of the present disclosure, driving may be controlled to be enabled or disabled according to a component, dielectric breakdown of which occurs, and thus, a conventional ineffective operation that disables driving due to power shutdown may be overcome, and whether driving is performed may be determined according to the component to perform effective driving, thereby driving efficiency.

Although the present disclosure has been shown and described with respect to specific exemplary embodiments, it will be obvious to those skilled in the art that the present disclosure may be variously modified and altered without departing from the spirit and scope of the present disclosure as defined by the following claims.

What is claimed is:

1. A drive control method based on detected dielectric breakdown, the method comprising steps of:
   determining whether dielectric breakdown of a high voltage system of a vehicle occurs by measuring entire dielectric resistance of the vehicle;
   individually determining whether dielectric breakdown of high voltage components, which include a high voltage battery, for the high voltage system occurs according to whether or not a switch for electrically connecting the high voltage battery with the remaining high voltage components other than the high voltage battery among the high voltage components is opened and a condition of each of the high voltage components when the dielectric breakdown of the high voltage system occurs; and
   stopping an operation of the high voltage components, the dielectric breakdown of which occurs, when the dielectric breakdown of high voltage components, which do not affect vehicle driving among the high voltage components, occurs, according to an individual determination result,
   wherein the step of individually determining includes determining that dielectric breakdown of the high voltage battery occurs when the vehicle is in an on state and the switch is in an off state, and
   wherein the step of individually determining includes determining whether dielectric breakdown of the remaining high voltage components occurs when the switch is in an on state.

2. The method of claim 1, further comprising maintaining the off state of the switch upon determining that the dielectric breakdown of the high voltage battery occurs.

3. The method of claim 1, wherein the step of individually determining includes determining that dielectric breakdown of a high voltage three-phase component occurs when the switch is in the on state and the high voltage three-phase component is operated via three-phase switching control among the high voltage components.

4. The method of claim 3, wherein the step of individually determining includes determining that the dielectric breakdown of the high voltage components except for both the high voltage battery and the high voltage three-phase component occurs when the switch is in the on state and the high voltage three-phase component does not operate.

5. The method of claim 1, wherein the step of individually determining includes determining that dielectric breakdown of a driving motor occurs when the switch is in the on state and a motor torque control command is applied to the driving motor.

6. The method of claim 5, wherein the step of stopping includes limiting an initial output of the high voltage battery and opening the switch after a set period of time elapses such that the switch is not in the on state during restart of the vehicle.

7. The method of claim 1, wherein the step of individually determining includes determining that dielectric breakdown of a hybrid starter generator (HSG) motor occurs when the switch is in the on state and an HSG motor torque control command is applied to the HSG motor.

8. The method of claim 7, wherein the step of stopping includes stopping a regenerative braking operation of the HSG motor.

9. The method of claim 1, wherein the step of individually determining includes determining that dielectric breakdown of an air blower motor of an air compressor occurs when the switch is in the on state and the air blower motor operates.

* * * * *